United States Patent [19]

Nishizawa et al.

[11] Patent Number: 4,470,059
[45] Date of Patent: Sep. 4, 1984

[54] GALLIUM ARSENIDE STATIC INDUCTION TRANSISTOR

[75] Inventors: Jun-ichi Nishizawa; Tadahiro Ohmi, both of Sendai, Japan

[73] Assignee: Zaidan Hojin Handotai Kenkyu Shinkokai, Sendai, Japan

[21] Appl. No.: 369,606

[22] Filed: Apr. 19, 1982

Related U.S. Application Data

[63] Continuation of Ser. No. 104,144, Dec. 17, 1979, abandoned.

[30] Foreign Application Priority Data

Jan. 22, 1979 [JP] Japan ................................. 54-6355

[51] Int. Cl.$^3$ ............................................ H01L 29/80
[52] U.S. Cl. ..................... 357/22; 357/23.4; 357/56
[58] Field of Search ............... 357/22, 23, 56, 22.5

[56] References Cited

U.S. PATENT DOCUMENTS

| Re. 29,971 | 5/1972 | Nishizawa | 357/22 |
| 4,216,029 | 8/1980 | Ohki | 357/23 X |
| 4,284,997 | 6/1978 | Nishizawa | 357/22 |

OTHER PUBLICATIONS

Sze, "*Physics of Semiconductors*", p. 89, J. Wiley & Sons, N.Y. 1969.

*Primary Examiner*—Martin H. Edlow
*Attorney, Agent, or Firm*—Cushman, Darby & Cushman

[57] ABSTRACT

A gallium arsenide static induction transistor of normally-off type simple in manufacture and exhibiting a superior function and suitable for use in low and medium power operation in integrated circuit is obtained by arranging so that its channel region has a length $l$ ($\mu$m), a width ($\mu$m) and an impurity concentration N (cm$^{-3}$), and that the ratio $l/w$ is 0.5–5.0 and that the product $Nw^2$ is not larger than $2.5 \times 10^{15}$ cm$^{-3} \cdot \mu$m$^2$.

10 Claims, 12 Drawing Figures

GALLIUM ARSENIDE STATIC INDUCTION TRANSISTOR

This is a continuation, of application Ser. No. 104,144 filed Dec. 17, 1979, now abandoned.

BACKGROUND OF THE INVENTION

1. Field of the Invention

The present invention relates to a gallium arsenide static induction transistor, and more particularly it pertains to a normally-off type gallium arsenide static induction transistor which is suitable for use in, for example, low and medium power operation in, for example, integrated circuits.

2. Brief Description of the Prior Art

A static induction transistor (SIT) has a structure resembling that of a known field effect transistor. However, the static induction transistor differs greatly from known field effect transistors in that width and impurity concentration of the channel region of an SIT enables formation of a potential barrier within the channel region by the built-in potential of the gate region and the potential applied to this gate region. The potential barrier can be present during conduction by the transistor. The location within the channel region at which the potential barrier is produced is called intrinsic gate.

In a static induction transistor the height of the potential barrier at the intrinsic gate is controlled not only by the gate potential but also by the drain potential. The control of the potential barrier height by variations of the drain currents, in the SIT, is provided by making the effective resistance between the source electrode and the intrinsic gate very small.

Gallium arsenide has pronounced features of a very high electron mobility and a wide energy gap as compared with those of silicon. The manufacturing processes of gallium arsenide devices, however, typically have not been exploited. Thus, it is desirable that a gallium arsenide transistor, particularly when it is employed in an integrated circuit, have a simple structure.

SUMMARY OF THE INVENTION

It is the object of the present invention to provide a gallium arsenide static induction transistor which is simple to manufacture and which exhibits superior characteristics.

BRIEF DESCRIPTION OF THE DRAWINGS

Preferred exemplary embodiments will hereinafter be described in conjunction with the appended drawing, wherein like numerals denote like elements and.

DETAILED DESCRIPTION OF THE PREFERRED EMBODIMENTS

Figure 1A:
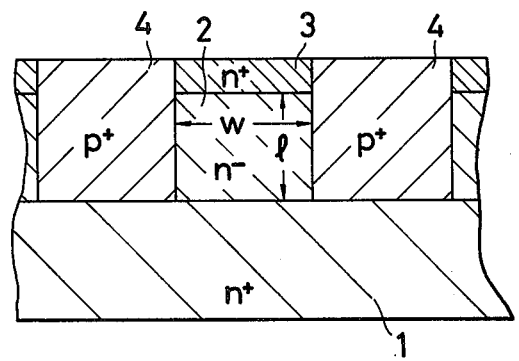
FIG. 1A is a sectional view of a simple embodiment of a transistor in accordance with the present invention.

According to one embodiment of the present invention, there is provided a gallium arsenide static induction transistor which has a channel region having a length l (micrometers, $\mu m$), a width w ($\mu m$) and an impurity (carrier) concentration N ($cm^{-3}$), and in which the ration l/w of the length l to the width w is 0.5 to 5.0, and the product $Nw^2$ is not larger than $2.5 \times 10^{15}$ $cm^{-3}$ ($\mu m^2$) = $2.5 \times 10^7$ $cm^{-1}$.

A static induction transistor has a source region, a channel region, a drain region, and a gate structure for controlling the movement of charge carriers passing through the channel regions. Hereinafter, the channel region should be understood to mean a high resistivity extending from a low resistivity source region up to that end portion of the gate structure located nearest the drain. The region located between the channel region and the low resistivity drain region will hereunder be called a subdrain region.

The gate structure may be of the junction-gate type, the insulated-gate type, or the Schottky-gate type. However, in the static induction transistor of the depletion mode wherein the effective channel region is defined by a depletion layer, the principal of operation is substantially the same for all these gate structures. As will be understood by those skilled in the art, there is a difference between the junction gate structure and the insulated-gate structure. That is, it is possible in the junction structure to cause, injection of charge carriers when forwardly biased, while the insulated-gate structure, provides no such possibility. In the present invention, however, the aspect of forming a potential barrier at the intrinsic gate, and ensuring establishment of the cut-off state is primarily considered, and the presence or absence of injection of carriers is disregarded.

In a simple static induction transistor, the gate region extends from the same surface as that of one main electrode (source electrode or drain electrode) toward the other main electrode. A typical example is the so-called planar type transistor in which the source (or drain) region and the gate region extend from the same planar surface toward the internal portion of the semiconductor body. Since the source region and the drain region can be mutually exchanged (i.e. can be normally or inversely operated) in this specification, one of these two regions will hereunder be called one main electrode (or the first element), and the other called the other main electrode (or second element).

When the first element (e.g., source) and a gate structure extend from substantially the same planar surface and a certain drain-to-source voltage is applied, the intrinsic gate usually is formed, at a location within the channel region closer of the first element (e.g. source) but separates therefrom (e.g. not contiguous therewith).

In an integrated logic circuit, it is desirable that the range of variation of input signal voltage and the range of variation of an output voltage be substantially equal to each other in order to make inter-stage or intra-logic connection easy. Also, in order to minimize power dissipation, the power supply source voltage is preferably low. From these viewpoints, it is desirable that a transistor provide an output voltage of about one V in response to a signal voltage swing of within about one V. In such a transistor, the voltage amplification factor is not so important. Thus, the distance between the gate region and drain region may be small.

The present inventor has conducted a theoretical analysis of potential distribution within the channel region of a static induction transistor, and as a result of experiments based on this analysis, has found the following. With respect to a static induction transistor having a gate structure and a first element (e.g. source) extending from substantially the same planar surface toward the second element (e.g., drain). In such a device, where the gate structure extends from the first element (e.g., source) to the second element (e.g., drain), it is very difficult or impossible to produce a normally-off type potential barrier in the channel region if the ratio l/w of the channel length l to the channel width w (as defined by the gate structure) is about 0.5 or smaller, irrespective of the degree of impurity concentration of the channel region. Accordingly, when the ratio l/w is not greater than 0.5, it is difficult to construct a normally-off type static induction transistor which is suitable for use in an integrated circuit. Also, if the aforesaid ratio l/w is greater than about 5, the resistance component becomes great so that the value of current per unit area becomes small, and hence the static induction transistor becomes unsuitable for use in an integrated circuit designed for operation at a low level of potential. Furthermore, where the ratio l/w is greater than about 5, the transit time of the carriers becomes prolonged, the transductance $g_m$ becomes small, and the gate capacitance tends to increase. This deleteriously effects the high frequency characteristic of the transistor. Moreover, the on-resistance of the device also increases.

Accordingly, in a static induction transistor having a first element (e.g. source) and a gate structure extending from substantially the same planar surface toward the second element (e.g., drain), it is desirable that the ratio l/w of the length l to the width w of the channel be selected between about 0.5 and about 5. The impurity concentration N of the channel region of a gallium arsenide static induction transistor is determined by taking the ratio l/w and the width of the channel region into consideration and to satisfy the condition of $Nw^2 < 2.5 \times 10^{15}$ (cm$^{-3}$) ($\mu$m$^2$).

Where it is intended to set noise margin at a large value, the aforesaid ratio l/w desirably is set at about 0.7 or greater. Further to limit the off-time current at a small value, it is desirable the l/w ratio be set at 1 (unity) or greater, or to provide a high resistivity (sub-drain or intermediate) region between the gate structure and the second element (e.g., drain) having a thickness of about 1/2 or greater. Moreover, if the transistor is intended to have a high breakdown voltage and to operate at high power levels, it is desirable to select a high value for the thickness (length) of the sub-drain between the gate structure and the second element (e.g., drain).

The present invention will be described in further detail by referring to the accompanying drawings.

A junction-gate type Static Induction Transistor (SIT) will now be described. A normally off-type static induction transistor in which no current is allowed to flow at zero voltage can be provided by a junction type structure. Normally-off state is achieved by properly selecting the channel width (defined by the gate-to-gate distance), the channel length defined by the length of the gate region (along the source-to-drain direction) and the impurity concentration of the channel region. A normally-off static induction transistor can be turned on by the application of a forward voltage to the gate regions. Since a forward voltage is applied to the gate regions, a gate current naturally flows so that minority carriers are injected from the gate regions into the channel region. Since the channel region of an SIT normally manifests a very low impurity concentration, such as of the order of $10^{15}$ cm$^{-3}$ or smaller, the quantities of minority carriers which are injected from the gate region can become greater by several orders of magnitude than the value of the impurity concentration of the channel region. Since its operation entails carrier injection from the gate region, the normally-off type junction SIT is called a bipolar-mode SIT (hereinafter to be referred to as B-SIT).

The current-voltage characteristic of the B-SIT is unique. In contrast to a known SIT, which exhibits a non-saturating type current-voltage characteristic, the B-SIT exhibits a saturating type characteristic. Also, the increase in the drain current in a low drain voltage region of the B-SIT characteristic is extremely steep. The current increases by 7~8 orders with an increase in the drain voltage of 1~2 mV. Also, the drain voltage at which the current becomes saturated is small, being of the order of 0.1 V. Thus, the B-SIT has a very low output impedance, and the resistance exhibited during conduction is small. As such, the B-SIT is not only effective when used in an integrated circuit, but also provides an efficient switching device for large current applications.

Figure 1B:
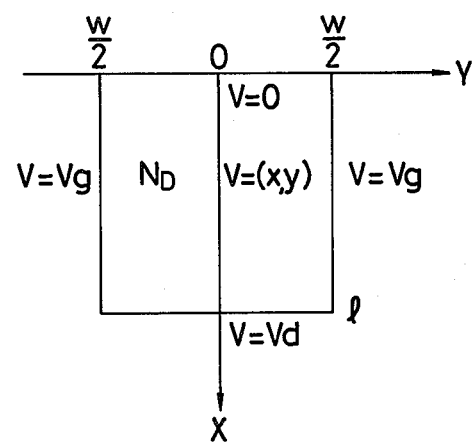
FIG. 1B is a diagrammatic illustration of a design model.

FIGS. 1A and 1B show a basic embodiment which is also used as a design model for various other embodiments to be described. In FIG. 1A, n$^+$ type regions, 1 and 3 represent a drain region and a source region, and a p$^+$ type region 4 represents a gate region. The n$^-$ type region 2 represents a channel region. Symbol w represents the width of the channel region (i.e., the distance between the respective gate regions 4), and symbol l represents the length of this channel region.

FIG. 1B shows identification of the co-ordinates and potentials for calculating the potential distribution within the channel region of the device shown in FIG. 1A. The built-in potential between the gate region and the channel region of an SIT is designated by $V_{bi}$. Gallium arsenide has an energy gap of about 1.4 eV, and the built-in potential $V_{bi}$ of a gallium arsenide SIT may range from about 0.7 to about 1.3 eV. As is well known, the built-in voltage $V_{bi}$ is given by kT/q $l_n$ NN$_A$/n$_i^2$, wherein k, T, q, N$_A$ and n$_i$ represent Boltzmann's constant, temperature, unit charge, impurity concentration in the p$^+$ gate region; and intrinsic carrier concentration in GaAs such as $2 \times 10^8$ cm$^{-3}$ at room temperature, respectively. Thus, if N$_A = 1 \times 10^{19}$ cm$^{-3}$, N$=1 \times 10^{13}$ cm$^{-3}$, N$=1 \times 10^{14}$ cm$^{-3}$ and N$=1 \times 10^{15}$ cm$^{-3}$, the value of $V_{bi}$ will be 0.92 V, 0.98 V and 1.22 V, respectively. The gate voltage is designated as $V_g$, and the drain voltage is designated by $V_d$. The potential distributions at $V_g = 0.125$ $V_{bi}$, and $V_d = 0.875$ $V_{bi}$ (which are typical values for a cut-off state when this transistor is employed in an integrated circuit) are shown in FIGS. 2 and 3.

Figure 2A:
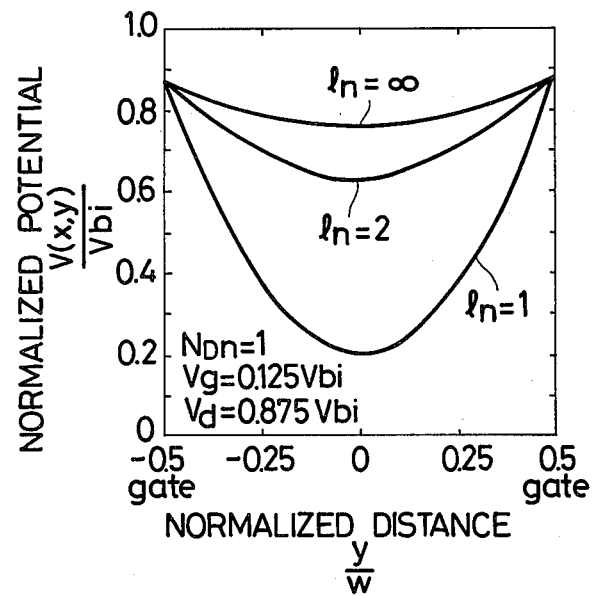
FIGS. 2A and 2B are graphs illustrating potential distributions across the channel region.
Figure 2B:
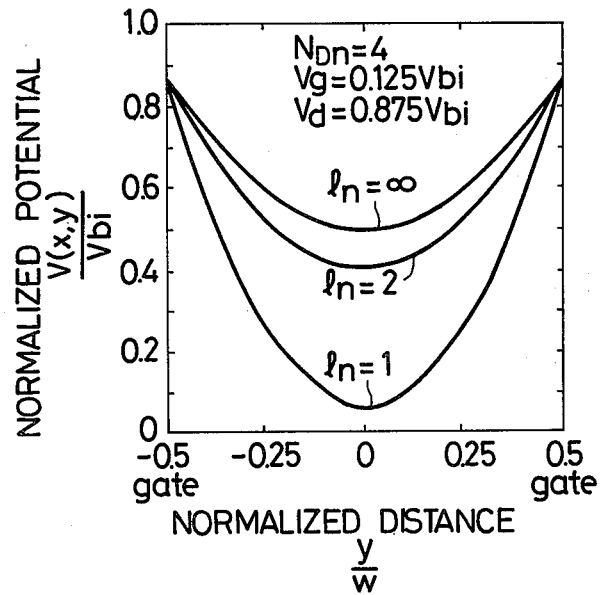
Figure 3:
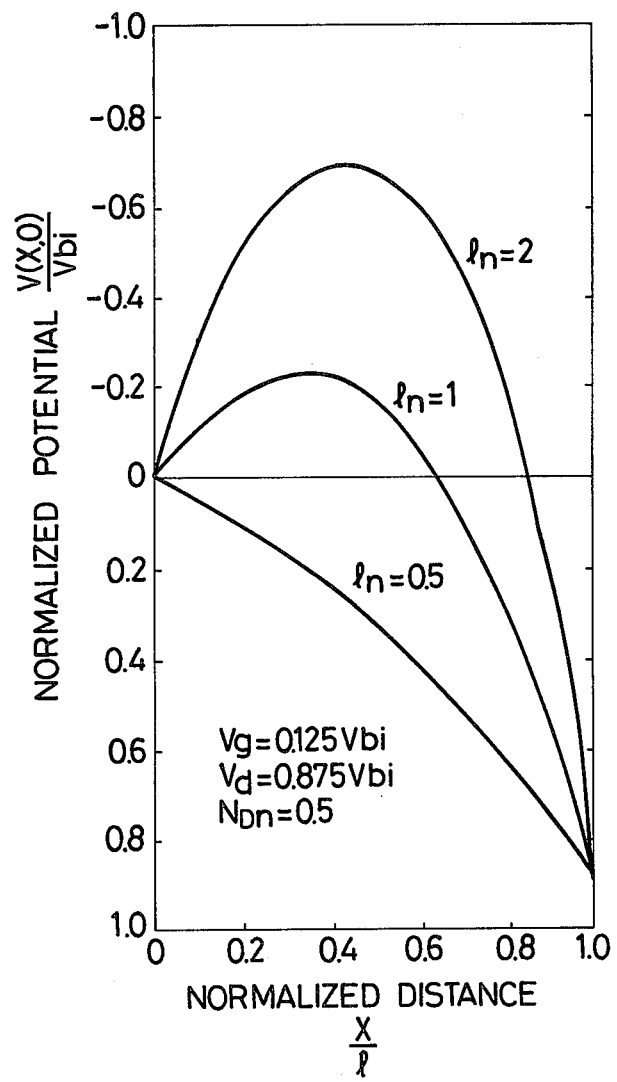
FIG. 3 is a graph of potential distribution in the source-to-drain direction when $N_{Dn}=0.5$.

FIGS. 2A and 2B each depict the potential distributions across the channel region (in the y direction). As is seen in FIG. 2, an effective potential barrier is formed at the site at which the potential barrier is the highest along a path between the source region and the drain region. The abscissa represents normalized distance y/w i.e., the transverse distance normalized by the channel width w. The ordinate represents a normalized potential V/V$_{bi}$ which is the potential in the channel region V normalized by built-in potential V$_{bi}$. The parameter $l_n$ represents a normalized channel length $l/w$ which is the channel length normalized by channel width $w$. The normalized impurity concentration $N_{Dn}=N_Dqw^2/\epsilon V_{bi}$, where q represents the magnitude of an electronic charge, and $\epsilon$ represents dielectric constant, i.e., the normalized impurity concentration $N_{Dn}$ is the impurity concentration normalized by $\epsilon V_{bi}/qw^2$. FIG. 2A shows an instance wherein $N_{Dn}=1$. FIG. 2B shows an instance wherein $N_{Dn}=4$. The greater the value of $l_n$ is, i.e. the higher is the ratio of the channel length l to channel width w, the higher the potential barrier. As $l_n$ decreases, the source voltage and the drain voltage provide a strong effect on the internal portion of the channel region compared with the effect of gate voltage, so that the height of the potential barrier is lowered. As a matter of course, where the impurity concentration of the channel region is great, the height of the potential barrier is lower for given channel region dimensions. FIG. 3 illustrates potential distribution along the source-to-drain direction when $N_{Dn}=0.5$. This Figure represents the potential along the central part of the channel region, i.e. along y=0. Even when $N_{Dn}$ is made smaller than 0.5, the configuration of the potential distribution be substantially the same. From FIG. 3, it will be noted that, at $l_n=0.5$, no potential barrier appears in the channel region, however low the impurity concentration is set. This means that the device is unable to provide normally-off type operation. When $l_n$ reaches a value of 1, there appears a potential barrier of about 0.2 $V_{bi}$. Therefore, injection of carriers is shut off to a considerable degree, and the leakage current can be reduced to a very small value. Thus, a device with $l_n=1$ can provide normally-off type operation. At $l_n=2$, the height of the potential barrier is as much as 0.7 $V_{bi}$, and the device provides a perfectly cut-off state. If should be understood that, as the impurity concentration of the channel region is set greater, the height of the potential barrier will decrease. Accordingly, in order to provide cut-off of such a device $l_n$ must be made large. From FIG. 3, it will be clearly understood, also by referring to FIG. 2, that the potential barrier height of the device having $l_n=2$ is almost equal to that of the device having a very great channel length. From FIG. 3, it will be noted that a potential barrier begins to be formed where $l_n$ reaches a value of about 0.7. If the drain voltage $V_d$ is sufficiently small as compared with 0.875 $V_{bi}$, a potential barrier can be formed at $l_n=0.5$. As $V_d$ becomes greater, the potential barrier becomes lower.

To ensure that no current flows even at high drain voltages, $l_n$ must be made correspondingly large. If, however, a reverse gate bias can be applied (as in silicon SIT for power amplifier use), the aforementioned condition is mitigated, and cut-off of the drain voltage can be performed even with a small value of $l_n$. The potential profile for a reverse gate bias will assume substantially such configuration as that obtained by upwardly lifting the potential distribution of FIGS. 2A and 2B corresponding to the change in the gate potential from 0.875 $V_{bi}$ to $V_{bi}+V_g$ (wherein: $V_g$ represents an absolute value of the reverse gate bias). When such a transistor is used in an integrated circuit, the application of a reverse gate bias will lead to the necessity of provision of both positive and negative voltage supply sources, so that such arrangement is not normally practiced. Where the transistor is used as a discrete device, however application of a reverse gate bias can take place as a matter of course in order to increase the output power, enhance the operation speed, etc.

Figure 4:
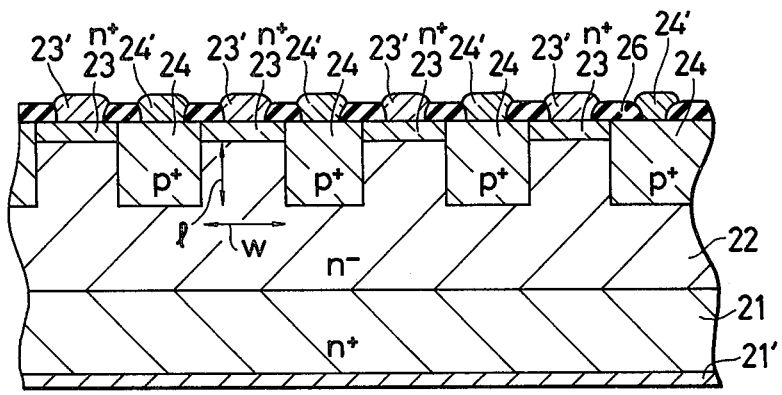
FIG. 4 is a diagrammatic sectional view of another embodiment according to the present invention.

FIG. 4 is a diagrammaic sectional view of a gallium arsenide (GaAs) SIT according to another embodiment of the present invention. Respective n+ type regions 21 and 23 represent a drain region and a source region, respectively, and a p+ type region 24 represents a gate region. An n⁻ type region 22 represents a region for constituting a channel region. Reference numerals 21', 23' and 24' represent a drain electrode, a source electrode and a gate electrode, respectively. Numeral 26 represents an insulating layer made of such substance as $SiO_2$, $Si_3N_4$, $Al_2O_3$, AlN, $GaO_xN_y$, or mixtures thereof. Ohmic electrodes for the n+ type regions are made of such alloys as, Au-Ge and Au-Ge-Ni. Ohmic electrodes for p+ type regions are made of such alloys as Cr-Au and Ag-Zn.

The structure shown in FIG. 4 can be constructed by first forming an n⁻ type layer and an n+ type layer on an n+ type GaAs substrate using continuous vapor phase growth techniques, and thereafter by ion-implantation of an impurity such as Be or Cd into a predetermined site to serve as a gate region. The impurities for the n type region and the p type region may be such substances as S, Se, Te and Sn, or such metals as Zn, Cd and Be. It should be noted here that, for GaAs, those elements such as Si or Ge of Group IV may be used both as the n type and as the p type impurities depending on the growth conditions employed. It is also possible to form the source region 23 by ion-implanation of such substances as S and Se.

The region l/w preferably is set at a value of about 0.7 or greater so that cut-off may be provided. Where l/w is 1 (unity) or greater, the cut-off is all the more perfect. Where, however, the value of $l_n$ is excessively great, a large current can not be output. Accordingly, the value of $l_n$ is selected at the minimum value necessary for providing cut-off in the desired operating state. As is apparent from FIG. 2, a device having $l_n=2$ exhibits a potential barrier height which is almost equal to that of the device having a very great channel length, so that $l_n$ is desired to be designed less than 2.

In a silicon SIT having a junction gate, the storage effect of those minority carriers injected from the gate region into the channel region substantially determine the upper limit of the operation speed. The cause for such limiting is that the life time of the minority carriers in silicon is long. On the other hand, GaAs is a semiconductor having a direct fundamental energy gap. Accordingly, holes which are injected from the p type gate region recombine with electrons and are annihilated very quickly. Therefore, the limitation of speed due to the storage effect of holes is mitigated. Thus, the switching speed of a junction gate GaAs device in accordance with the present invention is very fast.

The recombination time of carriers in GaAs is usually short, being in the range of about 1 nsec to about several nsec. The shortness of this recombination time does not appreciably degradate the characteristics of the device. The channel width w is chosen at a value of about 0.5–3.0 μm, and hence the dimension of the channel region in the vicinity of the source and gate regions is shorter than the diffusion length of the minority carriers. Further, current is not determined by the length of diffusion length of minority carriers but, rather by the dimensions of such regions as stated above. That is, hole diffusion length is given by $(D_p\tau_p)^{\frac{1}{2}}=(\mu_p kT\tau_p/q)^{\frac{1}{2}}$, wherein $D_p$, $\mu_p$ and $\tau_p$ represent diffusion coefficient;

mobility; and lifetime of holes, respectively. In a lightly-doped GaAs, $\mu_p$ is nearly equal to 350 cm$^2$/V·sec. Thus, if $\tau_p$ is equal to 1 nsec, 3 nsec, and 5 nsec, respectively, the hole diffusion length will be equal to 0.95 $\mu$m, 1.65 $\mu$m and 2.1 $\mu$m, respectively.

To ensure that the device exhibits a cut-off state at 0 gate voltage, the impurity concentration $N_D$ of the channel region is chosen to be a low value in accordance with the formula $N_D w^2 < 2.5 \times 10^{15}$ cm$^{-3} \cdot (\mu m^2) = 2.5 \times 10^7$ cm$^{-1}$. Thus, when w=1 $\mu$m, $N_D$ will be $2.5 \times 10^{15}$ cm$^{-3}$ or lower. A lower value of $N_D w^2$ elevates the height of the potential barrier in the channel. A condition, $N_D w^2 < 2 \times 10^{15}$ cm$^{-3}$ ($\mu m^2$) = $2 \times 10^7$ cm$^{-1}$, is preferable to materialize a normally-off type device which has a low leakage current. Thus, the device additionally has a feature that the speed at its switch-off time is extremely great, while maintaining the low impedance and very small saturating voltage features of the B-SIT. Where a reverse gate bias is applied, holes which have entered the channel region at the switch-off time are absorbed by the gate very quickly, so that the switch-off speed increases all the more.

The mobility of electrons is GaAs is extremely great. In contrast to the mobility of 1,000–1,500 cm$^2$/V.sec in silicon, the mobility in GaAs is as great as 8,000–10,000 cm$^2$/V.sec. Accordingly, even with a voltage of about 0.1 V during conducting a large current can flow. Thus, the low impedance property of the B-SIT is all the more prominent.

Figure 5:
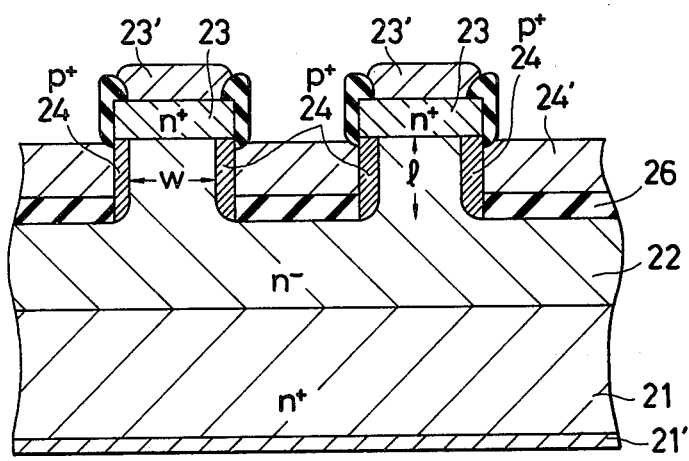
FIG. 5 is a diagrammatic sectional view of another embodiment of the present invention.

In operation of the B-SIT when a forward voltage is applied to the gate region, holes may be injected into the foreground of the source region. Those holes which are injected from the bottom surface of the gate region toward the drain are completely unnecessary and only contribute to increasing the storage effect of holes, and to reducing the current gain. Sectional view of an embodiment of the GaAs SIT of the present invention which eliminates the aforesaid drawbacks, by reducing unnecessary injection of holes is shown in FIG. 5. In this example, gate regions 24 are provided only on the side surfaces of the channel region portion of region 22. The channel region is formed by cut-outs from the principal surface of the device. As shown in FIG. 5, a gate electrode 24' is disposed in the cutout sections in ohmic contact with gates 24 and isolated from channel forming region 22 by an insulating layer 26. As also shown in FIG. 5, source 23 is disposed over the channel region. Holes are injected only in that portion of the channel located in the foreground of a source region 23. Therefore, the amount of holes injected toward the drain 21 is extremely small. In other words, the number of unnecessary holes in drastically reduced. Holes are injected effectively only into the channel region, thereby inducing the injection of electrons from source region 23 into the channel region. Thus, a device having a very great current gain and having a small hole storage effect is produced.

The above description has been with respect to normal type device structure, wherein the source region is provided adjacent to a principal surface and is smaller in size than that of the drain region. It should be understood, however, a similar device can be used in an upside-down configuration wherein the drain region is provided adjacent to the principal surface and is smaller in size than the source region. Such upside-down device may have the structure shown in FIG. 1A, in which the n+ type region 1 is used as the source region and the n+ type region 3 is used as the drain region. To provide effective injection of holes from the gate region into the channel region it is desirable that the impurity concentration of the p+ type gate region be set at a higher value. For example, it is desirable that this impurity concentration be selected at a value of at least about $10^{17}$ cm$^{-3}$. A value of $10^{18}$ cm$^{-3}$ or more is preferable. Similarly, in order to supply a sufficient quantity of electrons from the source region into the channel region, it is desirable to select the impurity concentration of the n+ type source region as high as possible, e.g., at a value of at least $10^{17}$ cm$^{-3}$. A value $10^{\sim}$cm$^{-3}$ or $10^{19}$ cm$^{-3}$ or more is preferable.

Figure 10:
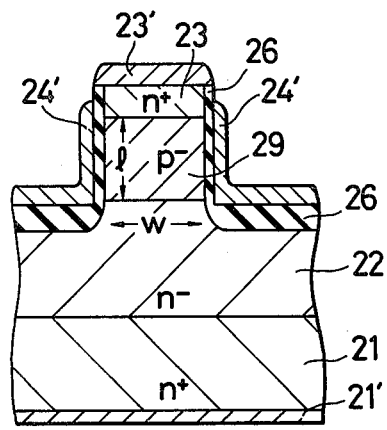

Further embodiments of the present invention are shown in FIGS. 6 through 10. The embodiments shown in FIGS. 6 through 9 represent junction gate structures. It should be noted that FIG. 10 represents an insulated-gate type structure. The respective channel widths w and channel lengths l are indicated in the drawings, respectively. These embodiments, include elements which have not been mentioned in conjunction with the preceding embodiments: the insulating region 27 shown in FIGS. 7 and 8; the n$^-$ type region 28 in FIG. 9; and the p$^-$ type region 29 in FIG. 10.

Figure 6:
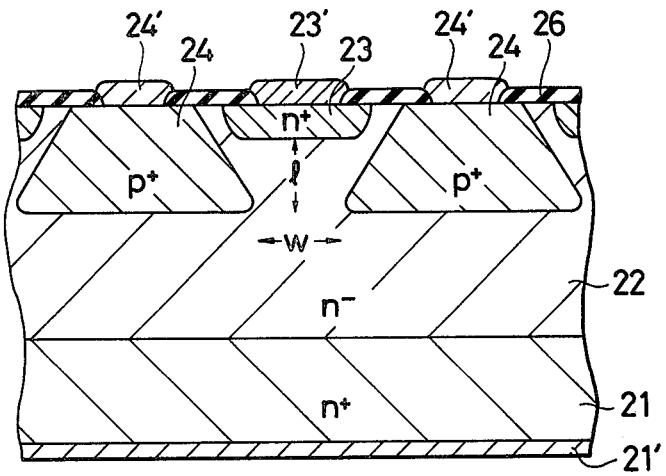
FIGS. 6 through 10 are diagrammatic sectional views of further embodiments of the present invention.
Figure 7:
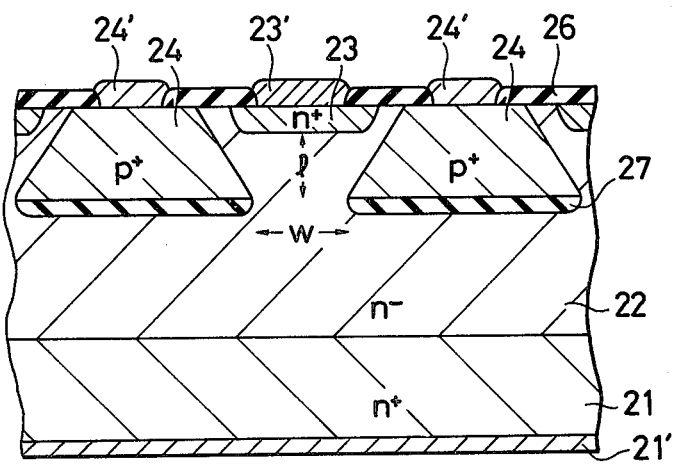

FIGS. 6 and 7 provide structures in which the p+ type gate regions 24 extend divergingly toward the internal portion of the semiconductor body. In FIG. 7, an insulating or semi-insulating layer 27 formed of silicon oxide, silicon nitride, aluminum oxide, aluminum nitride, gallium oxynitride, or their mixture, is provided on the bottom surface of each gate region. This gate structure is intended to suppress unnecessary injection of minority carriers from the gate region.

Figure 8:
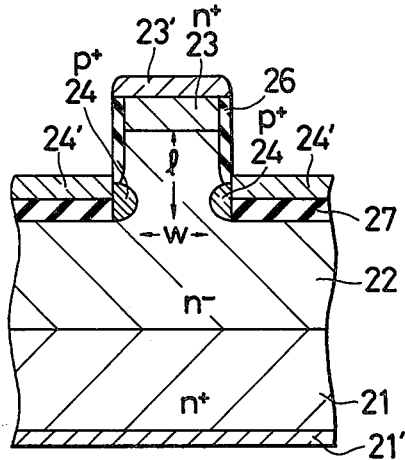

In FIG. 8, p+ type gate regions 24 are provided locally in the recessed region. Since gate regions 24 are of small size, the static capacitance of the device is small and unnecessary injection of minority carriers is reduced. Thus, this embodiment is suitable for high-speed operation.

Figure 9:
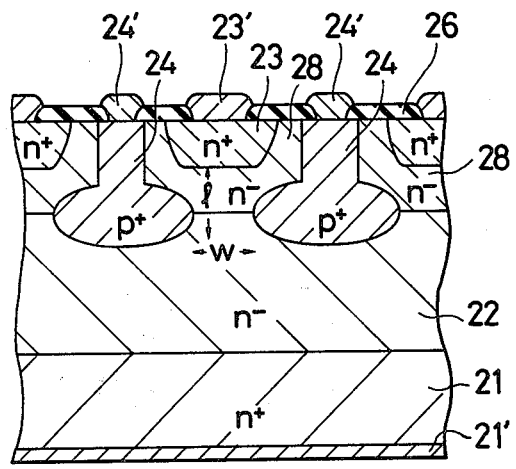

FIG. 9 shows a mixed structure of embedded gate structure and surface gate structure. The impurity concentration of the n$^-$ type region 28 may be substantially identical with that of the n$^-$ type region 22, or may be different from that of the latter.

FIG. 10 shows an example of an insulated-gate type structure, wherein gate electrode 24' is disposed along the sides of a p$^-$ channel region 29, separated from region 29, by insulating layer 26.

The structures of the SIT of the present invention, needless to say, are not limited to the particular embodiments shown hereinabove. A GaAs SIT having respective regions with reversed conductivity types with respect to those shown may also be made. In p$^-$ channel GaAs SIT, however, the characteristic of the device is considerably degraded due to low hole mobility of GaAs.

In FIGS. 4 and 5, the p+ type region 24 is shown to be in direct contact with the n+ type region 23. It should be understood, however, that these two regions may be separated from each other. Furthermore, the structure of the device may be such that an insulating material intervenes between the source region and the gate region.

In any case, it is only necessary that l/w is selected to fall within the range of from about 0.5 to about 5.0, and $N_D w^2$ is selected at most about $2.5 \times 10^{15}$ cm$^{-3} \cdot (\mu m^2) = 2.5 \times 10^7$ cm$^{-1}$ (wherein: $N_D$ is expressed in the unit of cm$^{-3}$ and w in the unit of $\mu$m), and more preferably $2\times10^{15}$ cm$^{-3}\cdot(\mu$m$^2)$ or lower. It would be clearly understood by those skilled in the art that various modifications of the structures of the present invention may be made.

The static induction transistors according to the present invention can be manufactured by relying on known crystal growth, ion-implantation, diffusion, oxidation, CVD, etching, fine processing, vapor-deposition, wiring or like techniques.

The gallium arsenide static induction transistor according to the present invention exhibits a normally-off type operation in the desired operating state, has a high input and a low output impedance, and is capable of high-speed operation. Thus, the device is particularly suitable for use in an integrated circuit.

What is claimed is:

1. A gallium arsenide normally off static induction transistor formed in a chip having a first and a second main surface and responsive to a forward gate bias, comprising:
    an n type high resistivity gallium arsenide region having a donor concentration $N_D$ and disposed adjacent to said first main surface;
    a first n type low resistivity gallium arsenide region formed in said high resistivity gallium arsenide region adjacent to said first main surface;
    a second n type low resistivity gallium arsenide region formed adjacent to said high resistivity gallium arsenide region on the side opposite to said first main surface; and
    a p type low resistivity gallium arsenide gate region formed in said high resistivity gallium arsenide region adjacent to said first main surface, and substantially surrounding said first n type low resistivity gallium arsenide region, and extending toward said second main surface farther than said first n type low resistivity gallium arsenide region, and defining a channel region of a length l and a width w in said high resistivity gallium arsenide region said width w being less than the diffusion length of minority carriers in said high resistivity gallium arsenide region,
    the product of said donor concentration $N_D$ and the square of said width w, i.e. $N_D w^2$, being not greater than about $2.5\times10^7$ cm$^{-1}$,
    the ratio of said length l to said width w, i.e. l/w, being not smaller than about 1.0 and not greater than about 2.0,
    thereby establishing a potential barrier in said channel region at zero gate bias.

2. A gallium arsenide static induction transistor according to claim 1, wherein: said ratio l/w is at least about 1.

3. A gallium arsenide static induction transistor according to claim 1 or 2, wherein: said p type gate region extends from said first main surface divergently into said high resistivity gallium arsenide region.

4. A gallium arsenide static induction transistor according to claim 1 or 2, wherein: said p type gate region locally has a portion bulging in said high resistivity gallium arsenide region at a site located distant from said first main surface.

5. A gallium arsenide static induction transistor according to claim 1 or 2, wherein: said p type gate region extends to and contacts said second low resistivity gallium arsenide region, and thereby said channel region is disposed adjacent to said second low resistivity gallium arsenide region.

6. A gallium arsenide static induction transistor according to claim 1 or 2, wherein: said high resistivity gallium arsenide region includes a portion disposed between said channel region and said second low resistivity gallium arsenide region, said portion having a thickness not less than about 1/2.

7. A gallium arsenide static induction transistor according to claim 6, further comprising: an insulating or semi-insulating region disposed between said high resistivity region portion and that surface of said p type gallium arsenide gate region not facing said channel region.

8. A gallium arsenide static induction transistor according to claim 7, wherein: said insulating region is made of a substance selected from the group of silicon oxide, silicon nitride, aluminum oxide, aluminum nitride, gallium oxynitride and their mixtures.

9. A gallium arsenide static induction transistor according to claim 1 or 2, wherein: said p type gate region extends from said first main surface divergently into said high resistivity gallium arsenide region.

10. A gallium arsenide static induction transistor according to claim 1 or 2, wherein: said p type gate region locally has a portion bulging in said high resistivity gallium arsenide region at a site located distant from said first main surface.

* * * * *